United States Patent
Howard et al.

(10) Patent No.: US 9,346,669 B2
(45) Date of Patent: May 24, 2016

(54) ROBUST MEMS STRUCTURE WITH VIA CAP AND RELATED METHOD

(71) Applicant: Newport Fab, Newport Beach, CA (US)

(72) Inventors: David J. Howard, Irvine, CA (US); Michael J. DeBar, Tustin, CA (US); Jeff Rose, Hawthorne, CA (US); Arjun Kar-Roy, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 14/719,187

(22) Filed: May 21, 2015

(65) Prior Publication Data
US 2015/0368094 A1    Dec. 24, 2015

Related U.S. Application Data

(60) Provisional application No. 62/016,505, filed on Jun. 24, 2014.

(51) Int. Cl.
| H01L 23/482 | (2006.01) |
| B81C 1/00 | (2006.01) |
| B81B 7/00 | (2006.01) |
| H01L 21/768 | (2006.01) |
| B81B 3/00 | (2006.01) |
| H01L 29/417 | (2006.01) |
| H01L 21/4763 | (2006.01) |

(52) U.S. Cl.
CPC ........... *B81C 1/00095* (2013.01); *B81B 7/0006* (2013.01); *B81B 3/007* (2013.01); *B81C 1/00111* (2013.01); *B81C 1/00166* (2013.01); *B81C 1/00658* (2013.01); *H01L 21/47635* (2013.01); *H01L 21/76883* (2013.01); *H01L 29/417* (2013.01)

(58) Field of Classification Search
CPC ............. H01L 21/47635; H01L 21/76883; H01L 29/417; B81B 3/007; B81C 1/00111; B81C 1/00166; B81C 1/00658
USPC ...................... 257/773; 438/98, 672
See application file for complete search history.

(56) References Cited

U.S. PATENT DOCUMENTS

| 7,387,939 B2* | 6/2008 | Manning | H01L 27/10852 257/E21.019 |
| 7,420,238 B2* | 9/2008 | Manning | H01L 27/10817 257/301 |
| 7,601,629 B2* | 10/2009 | Ramappa | H01L 21/76802 257/758 |
| 2004/0256559 A1* | 12/2004 | Ryu | G01J 5/02 250/338.3 |
| 2012/0138436 A1* | 6/2012 | Gambino | H01H 59/0009 200/181 |
| 2013/0207746 A1* | 8/2013 | Gupta | H03H 9/462 333/186 |
| 2015/0187714 A1* | 7/2015 | Bhatkar | H01L 24/13 257/737 |

* cited by examiner

*Primary Examiner* — George Fourson, III
(74) *Attorney, Agent, or Firm* — Farjami & Farjami LLP

(57) ABSTRACT

Self-supported MEMS structure and method for its formation are disclosed. An exemplary method includes forming a polymer layer over a MEMS plate over a substrate, forming a via collar along sidewalls of a first portion of a trench over the polymer layer, and forming a second portion of the trench within the polymer layer. The method also includes forming an oxide liner in the trench lining sidewalls of the via collar and sidewalls of the second portion of the trench, depositing a metallic filler in the trench to form a via, and forming a metal cap layer over the via collar and the metallic filler. The method further includes removing a portion of the metal cap layer to form a via cap, and removing the polymer layer such that the via is supported only on a bottom thereof by the substrate. An exemplary structure formed by the disclosed method is also disclosed.

20 Claims, 17 Drawing Sheets

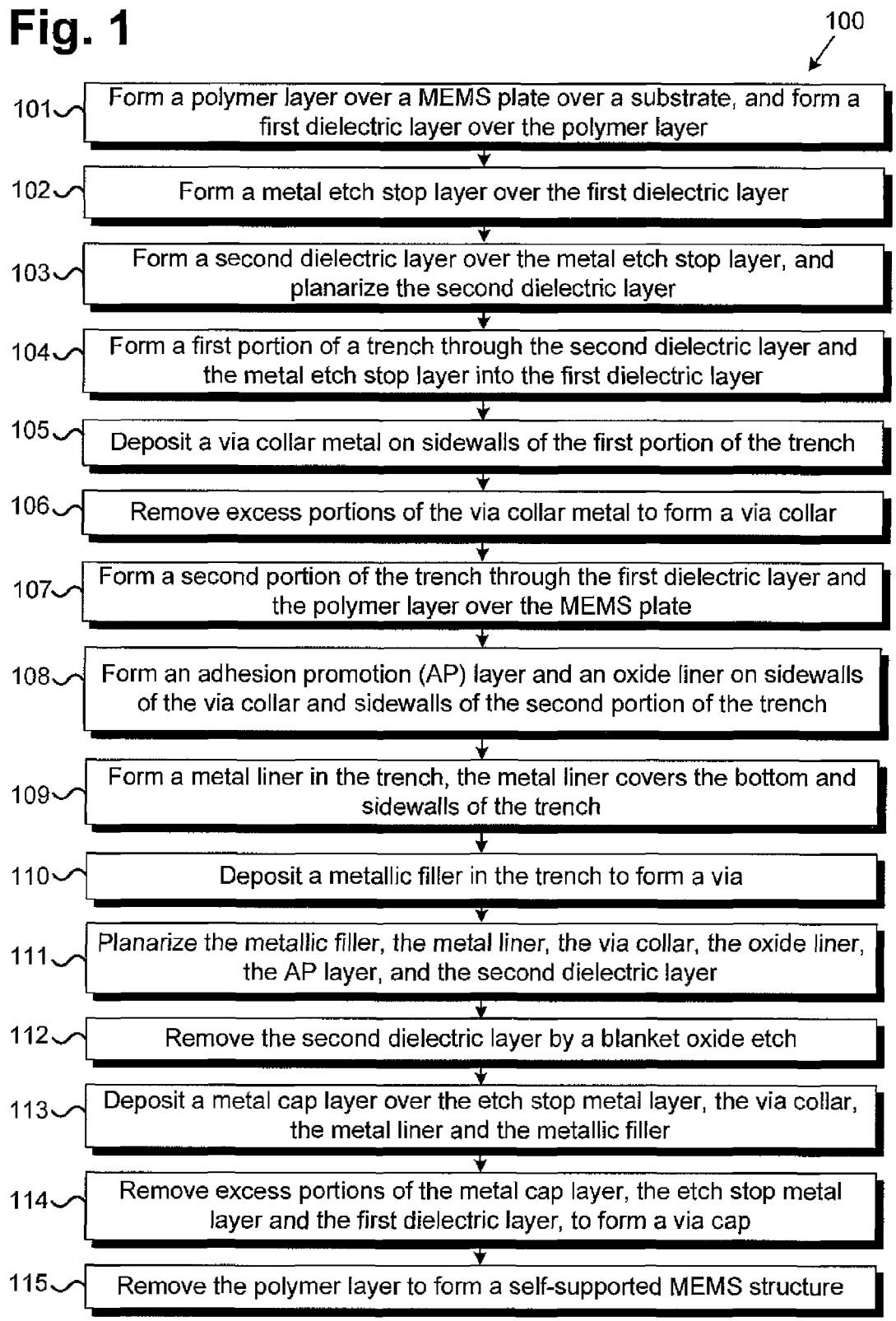

Fig. 1

- 101 — Form a polymer layer over a MEMS plate over a substrate, and form a first dielectric layer over the polymer layer
- 102 — Form a metal etch stop layer over the first dielectric layer
- 103 — Form a second dielectric layer over the metal etch stop layer, and planarize the second dielectric layer
- 104 — Form a first portion of a trench through the second dielectric layer and the metal etch stop layer into the first dielectric layer
- 105 — Deposit a via collar metal on sidewalls of the first portion of the trench
- 106 — Remove excess portions of the via collar metal to form a via collar
- 107 — Form a second portion of the trench through the first dielectric layer and the polymer layer over the MEMS plate
- 108 — Form an adhesion promotion (AP) layer and an oxide liner on sidewalls of the via collar and sidewalls of the second portion of the trench
- 109 — Form a metal liner in the trench, the metal liner covers the bottom and sidewalls of the trench
- 110 — Deposit a metallic filler in the trench to form a via
- 111 — Planarize the metallic filler, the metal liner, the via collar, the oxide liner, the AP layer, and the second dielectric layer
- 112 — Remove the second dielectric layer by a blanket oxide etch
- 113 — Deposit a metal cap layer over the etch stop metal layer, the via collar, the metal liner and the metallic filler
- 114 — Remove excess portions of the metal cap layer, the etch stop metal layer and the first dielectric layer, to form a via cap
- 115 — Remove the polymer layer to form a self-supported MEMS structure

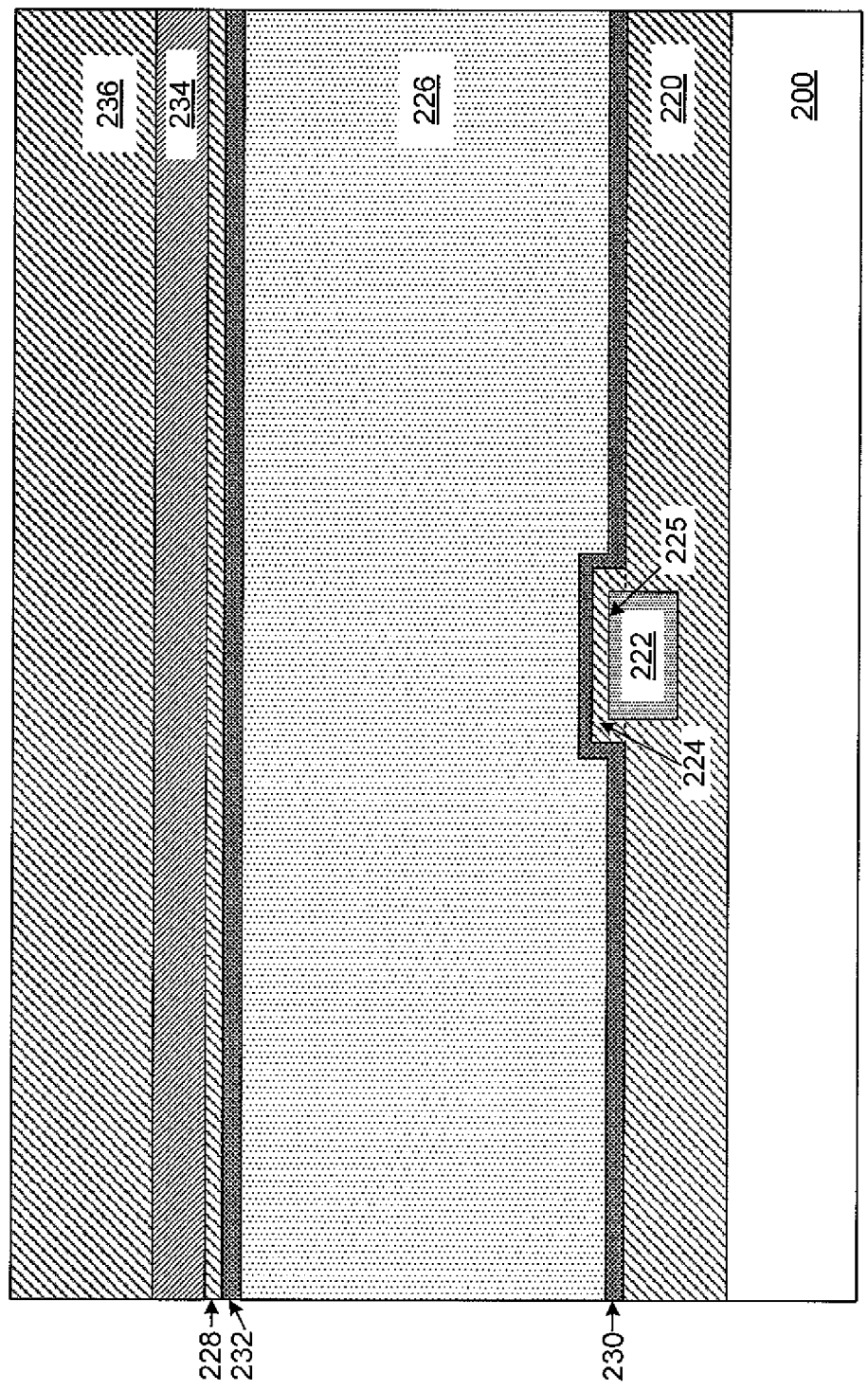

ROBUST MEMS STRUCTURE WITH VIA CAP AND RELATED METHOD

The present application claims the benefit of and priority to a provisional patent application entitled "Robust MEMS Structures with Metallic Caps," Ser. No. 62/016,505 filed on Jun. 24, 2014. The disclosure in this provisional application is hereby incorporated fully by reference into the present application.

BACKGROUND

Process integration of mechanical and/or electrical support features of Microelectromechanical systems (MEMS) devices often present the challenge of scaling the building blocks or fundamental units of the MEMS devices. For example, conventional MEMS devices, such as microbolometer structures, rely on large vias and trenches to support suspended sensor membranes. To achieve mechanical and/or electrical robustness, however, these large vias and trenches are difficult to scale down.

In a conventional approach of manufacturing a support structure for a suspended MEMS device, a large trench is formed in a sacrificial material layer, and then a metal is deposited in the trench. The formation of the trench in the sacrificial material layer, such as a polymer layer, presents challenges during manufacturing processes since polymers are visco-elastic and tend to outgas during thermal and chemical processes. The carbonaceous sacrificial material layer can in turn cause deformation of the trench as well as the metal filament inside. Via deformation may cause structural instability of the support structure. In some extreme cases, via deformation may cause mechanical and electrical detachment of the via from its underlying contact, which may render the MEMS device inoperable. Moreover, in the conventional approach, the support structure having the metal filling may be susceptible to chemical attacks on the sidewalls and the top surface of the support structure during subsequent BEOL (back end of line) processes. These attacks can weaken the support structure and cause electrical and mechanical contact problems.

As dimensions of MEMS structures continue to scale down in size, MEMS device support structures also need to scale down proportionally with the MEMS structures to conserve valuable surface area on a semiconductor wafer, while still being able to uphold the structural integrity of the MEMS structures. Thus, there is a need in the art for high volume manufacturing of robust self-supported MEMS structures.

SUMMARY

The present disclosure is directed to robust MEMS structure with via cap and related method, substantially as shown in and/or described in connection with at least one of the figures, and as set forth in the claims.

BRIEF DESCRIPTION OF THE DRAWINGS

FIG. 1 is a flowchart illustrating a method of forming a self-supported MEMS structure with a via cap according to one implementation of the present application.

FIG. 2C illustrates a cross-sectional view of a portion of a self-supported MEMS structure with a via cap processed in accordance with an intermediate action in the flowchart of FIG. 1 according to one implementation of the present application.

DETAILED DESCRIPTION

Figure 2A:
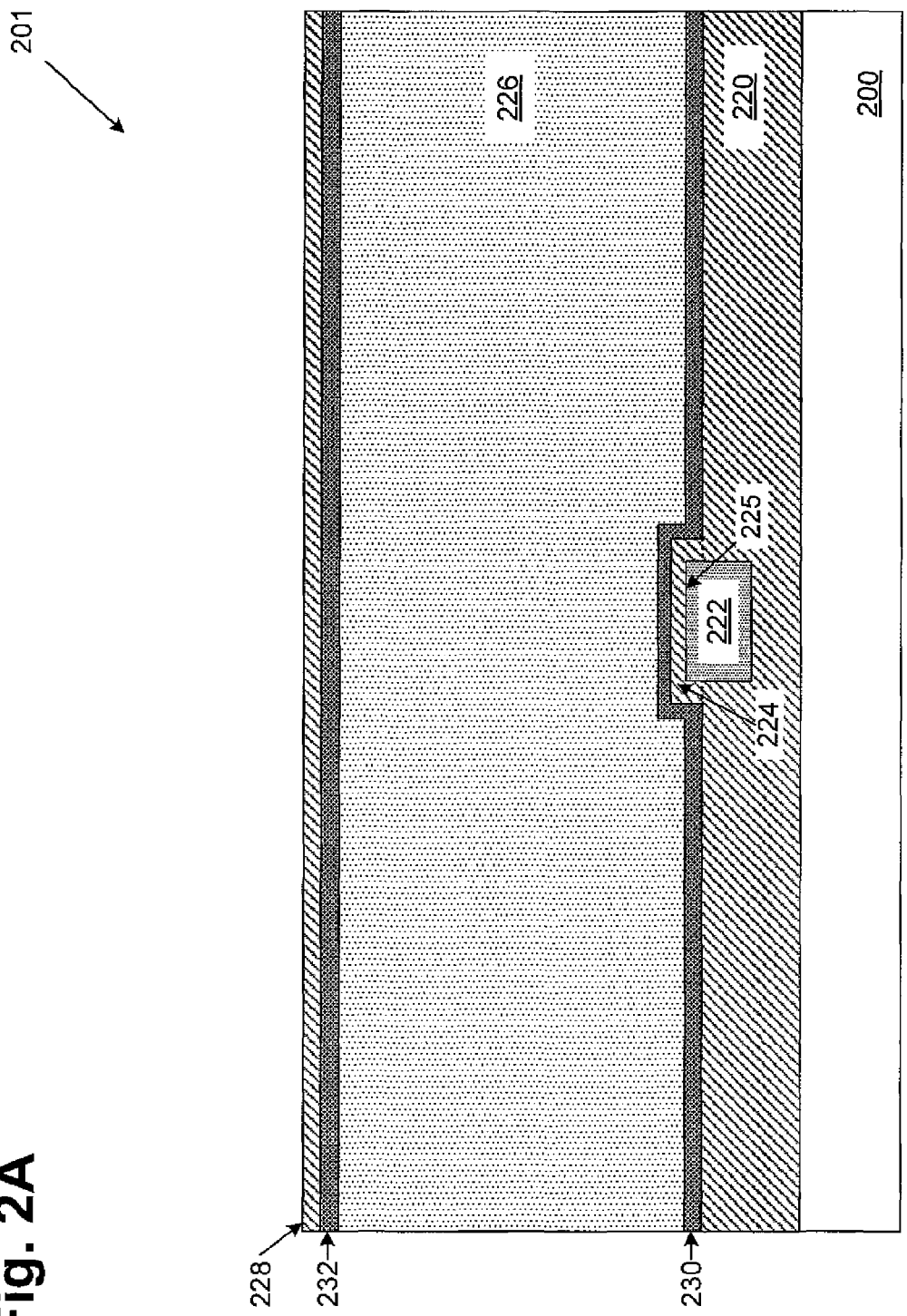
FIG. 2A illustrates a cross-sectional view of a portion of a self-supported MEMS structure with a via cap processed in accordance with an initial action in the flowchart of FIG. 1 according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 shows a flowchart illustrating an exemplary method of forming a self-supported MEMS structure with a via cap according to an implementation of the present inventive concepts. Certain details and features have been left out of flowchart 100 that are apparent to a person of ordinary skill in the art. For example, an action may consist of one or more sub-actions or may involve specialized equipment or materials, as known in the art. Actions 101 through 115 indicated in flowchart 100 are sufficient to describe one implementation of the present inventive concepts, other implementations of the present inventive concepts may utilize actions different from those shown in flowchart 100.

Figure 2B:
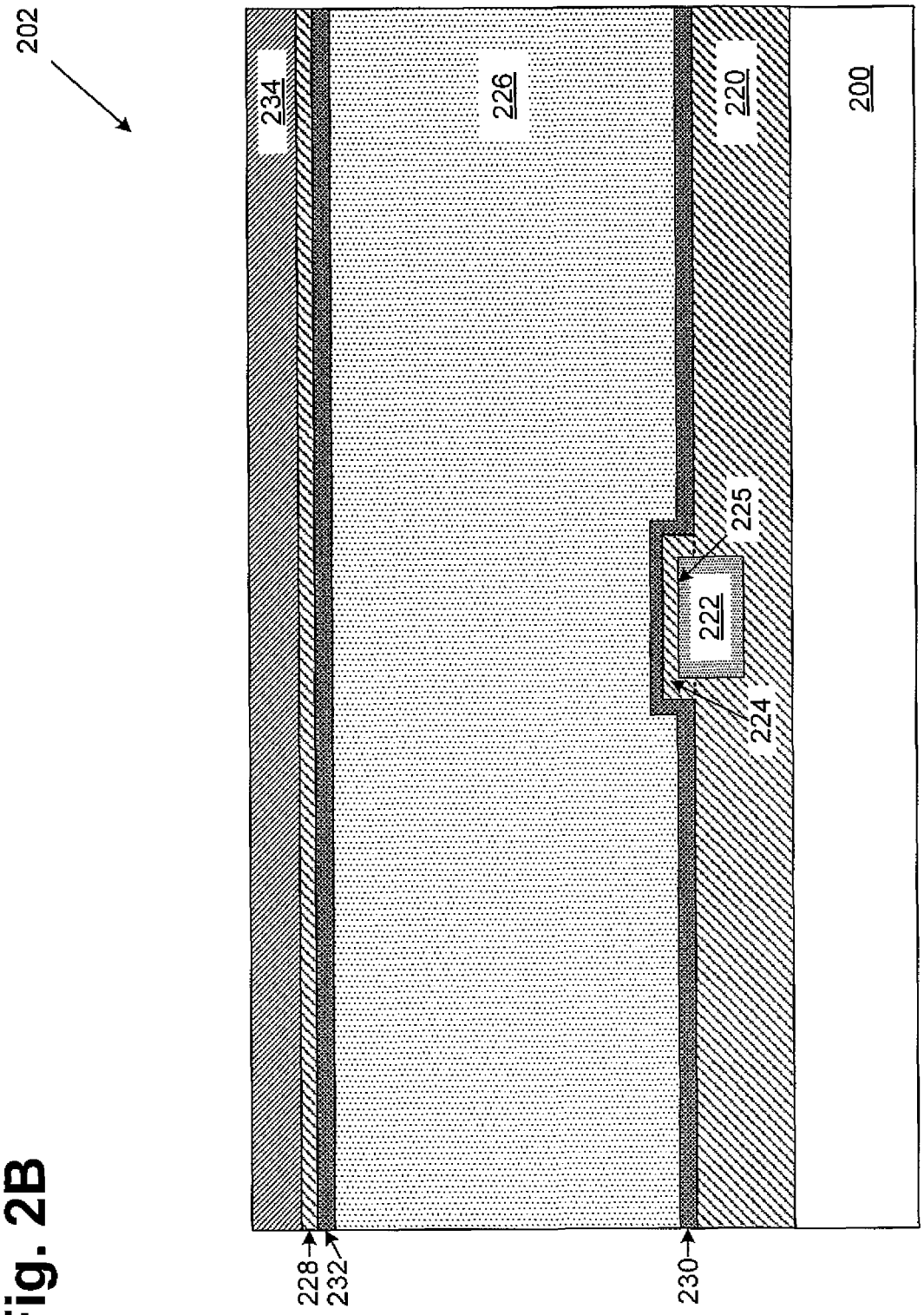
FIG. 2B illustrates a cross-sectional view of a portion of a self-supported MEMS structure with a via cap processed in accordance with an intermediate action in the flowchart of FIG. 1 according to one implementation of the present application.
Figure 2D:
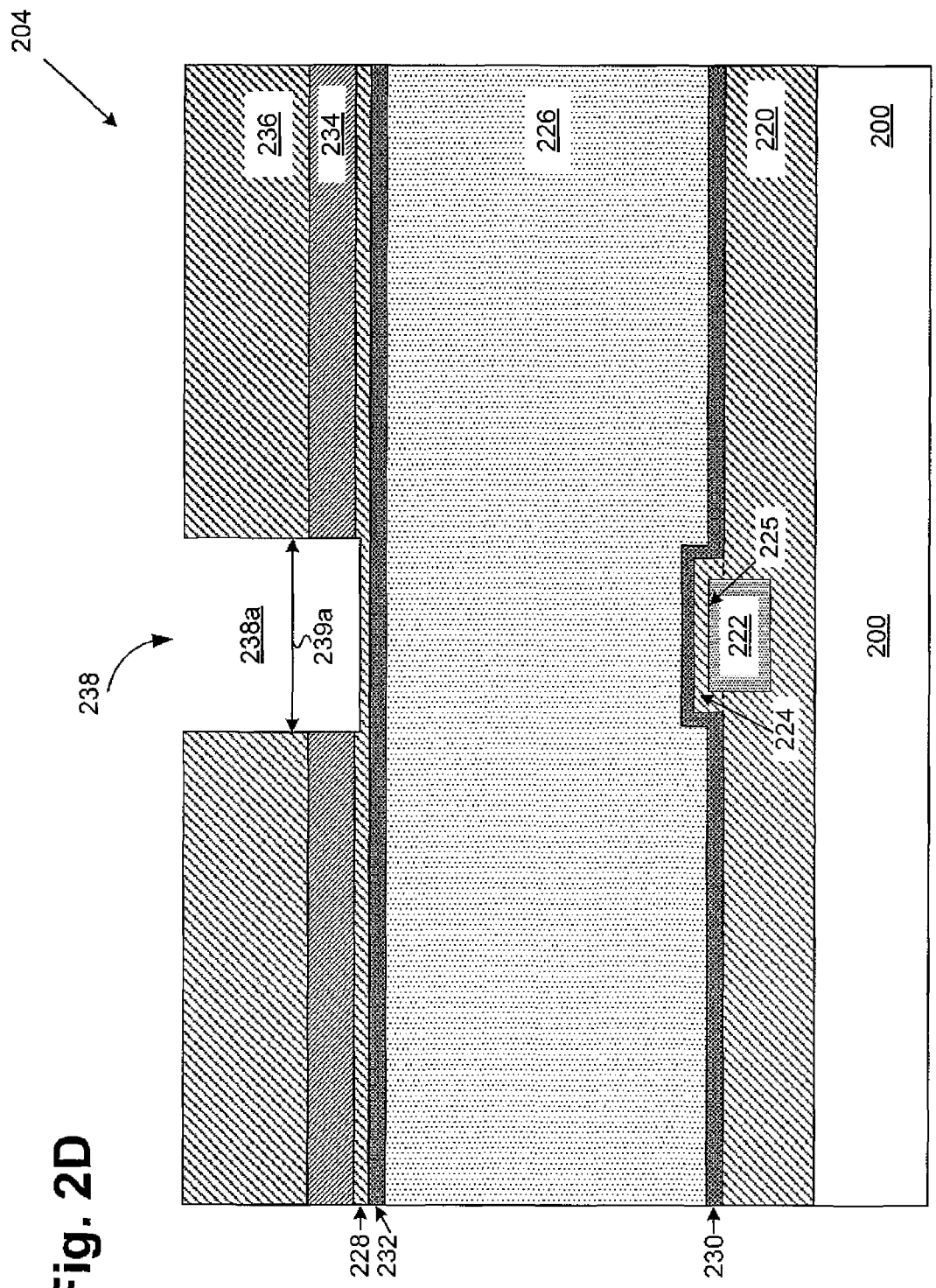
FIG. 2D illustrates a cross-sectional view of a portion of a self-supported MEMS structure with a via cap processed in accordance with an intermediate action in the flowchart of FIG. 1 according to one implementation of the present application.
Figure 2E:
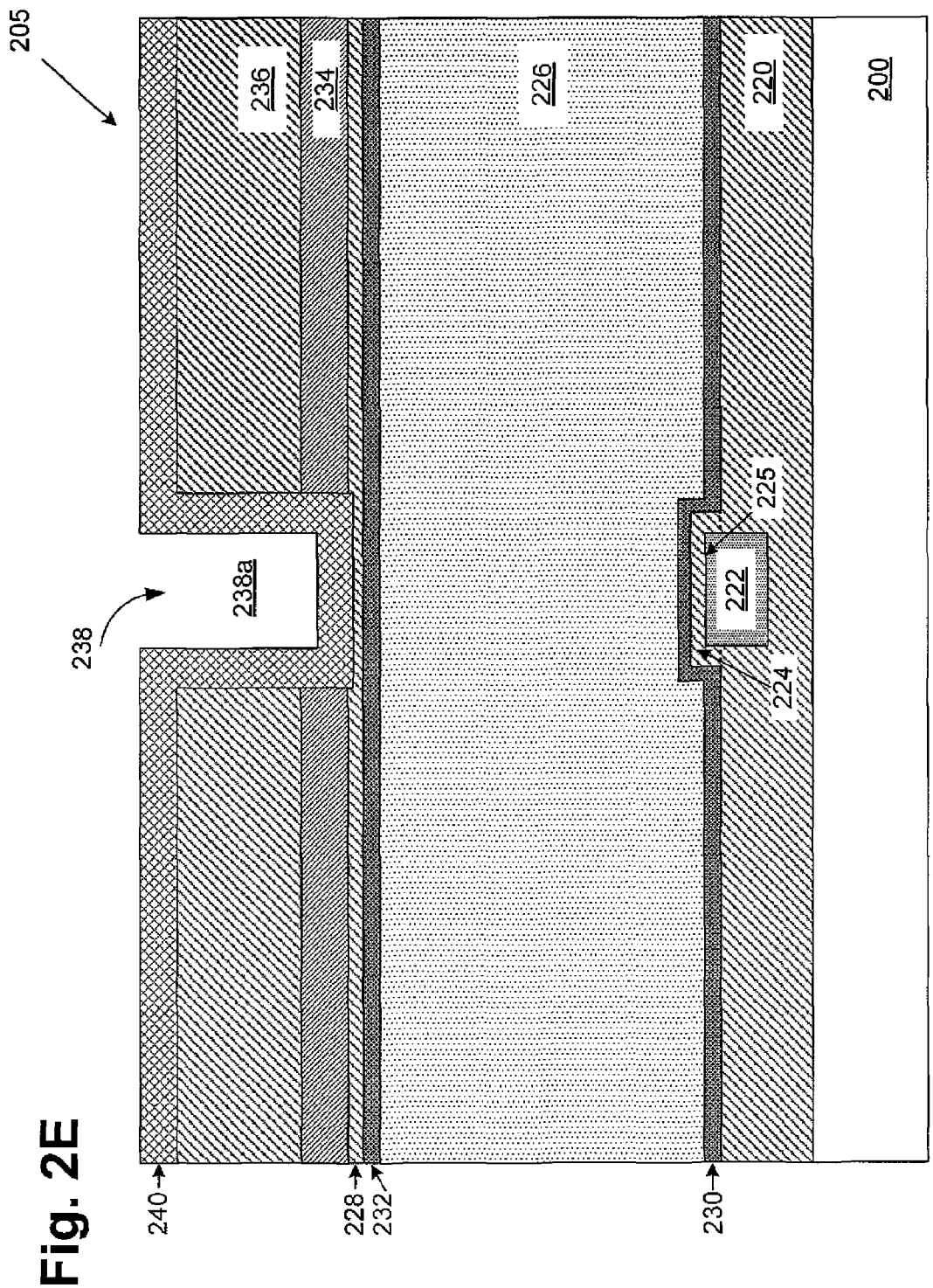
FIG. 2E illustrates a cross-sectional view of a portion of a self-supported MEMS structure with a via cap processed in accordance with an intermediate action in the flowchart of FIG. 1 according to one implementation of the present application.
Figure 2F:
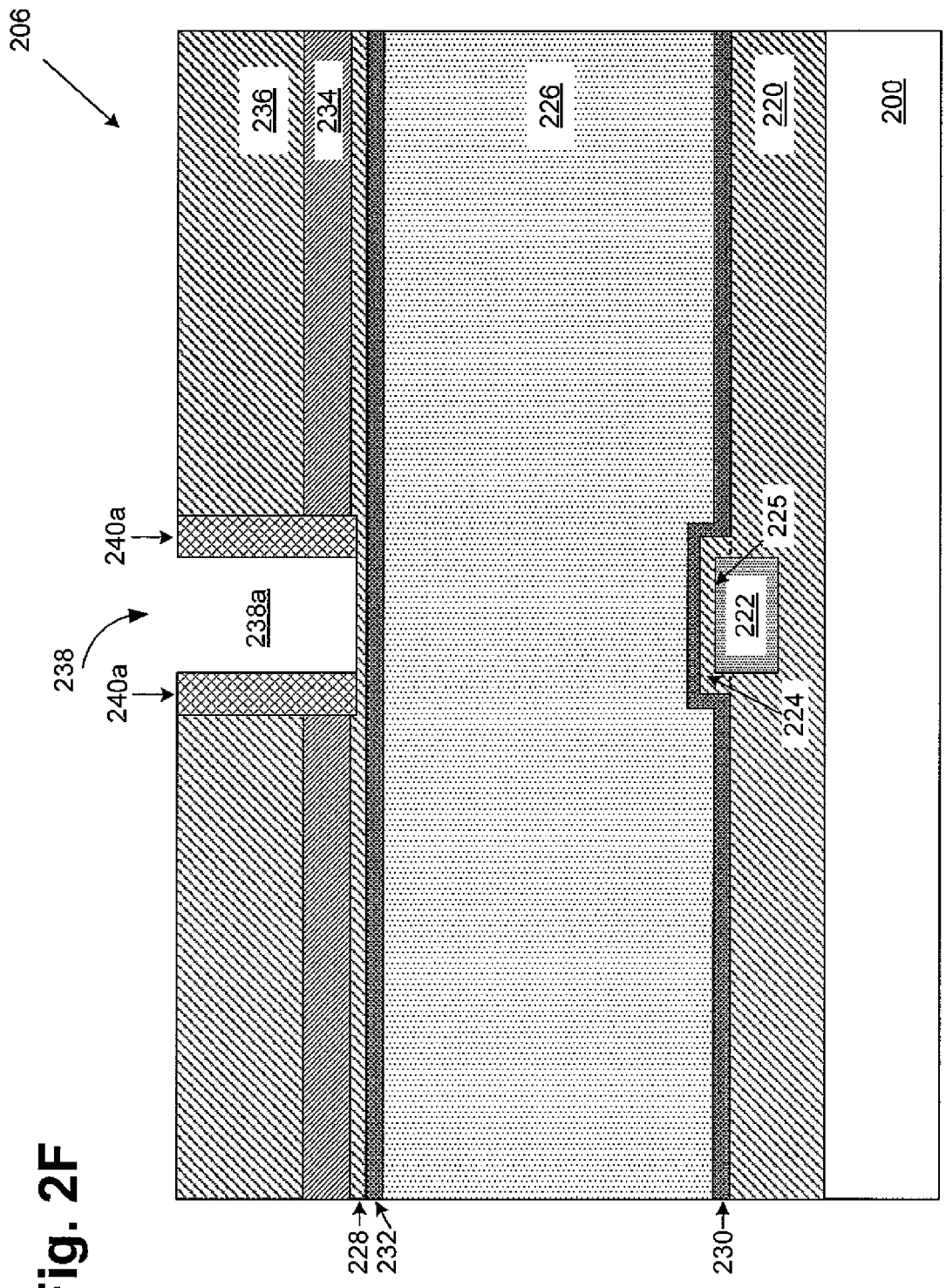
FIG. 2F illustrates a cross-sectional view of a portion of a self-supported MEMS structure with a via cap processed in accordance with an intermediate action in the flowchart of FIG. 1 according to one implementation of the present application.
Figure 2G:
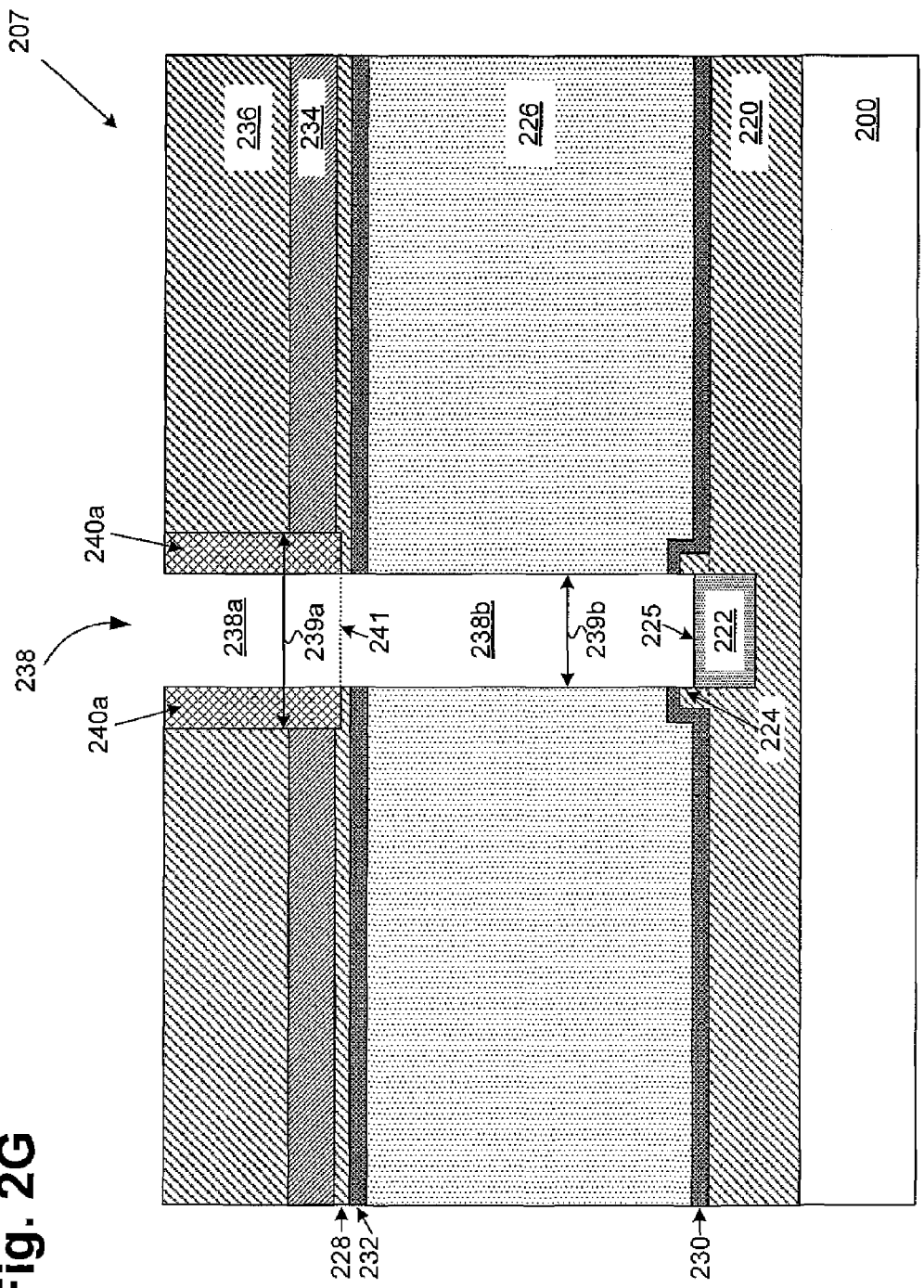
FIG. 2G illustrates a cross-sectional view of a portion of a self-supported MEMS structure with a via cap processed in accordance with an intermediate action in the flowchart of FIG. 1 according to one implementation of the present application.
Figure 2H:
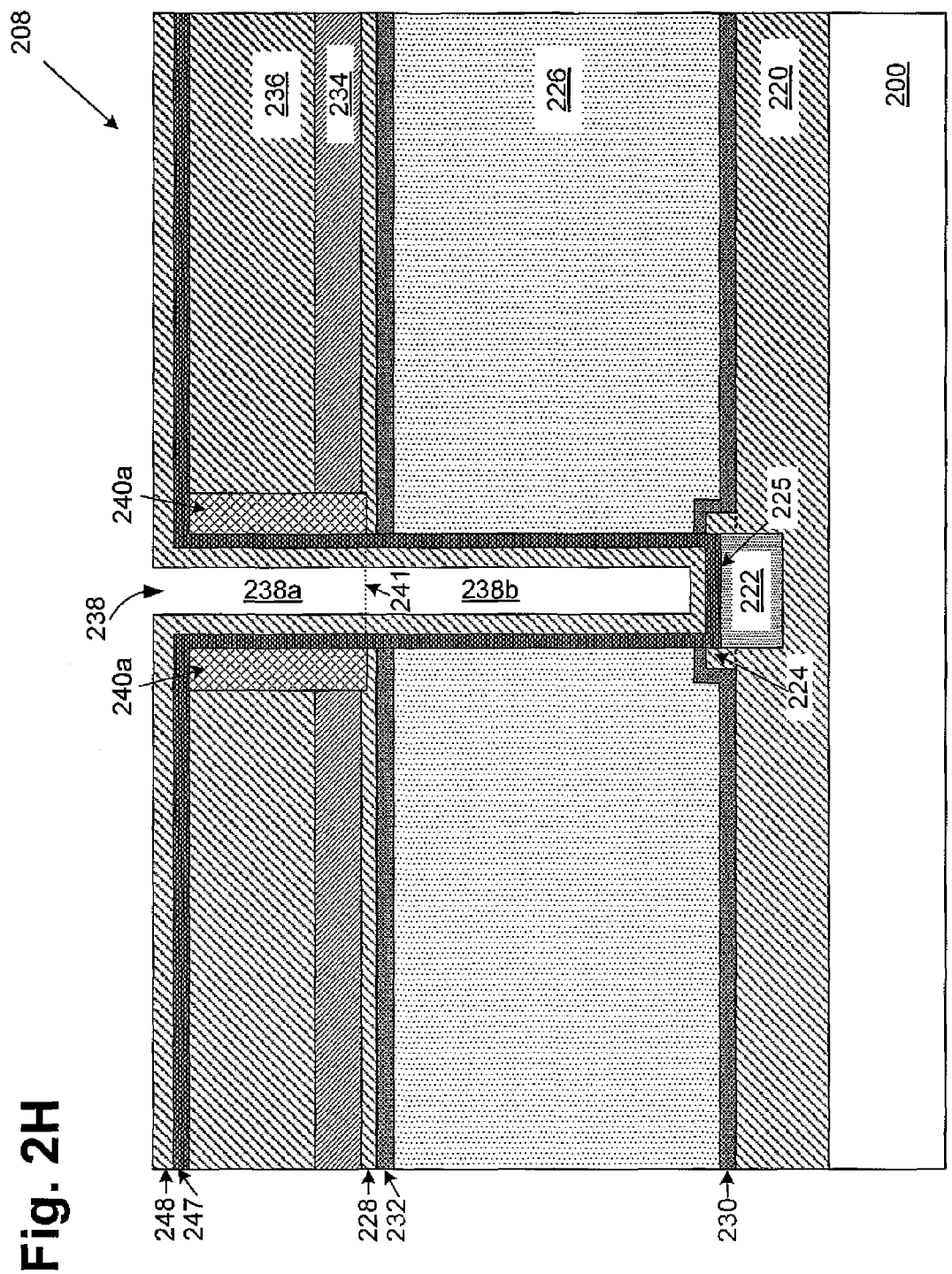
FIG. 2H illustrates a cross-sectional view of a portion of a self-supported MEMS structure with a via cap processed in accordance with an intermediate action in the flowchart of FIG. 1 according to one implementation of the present application.
Figure 2I:
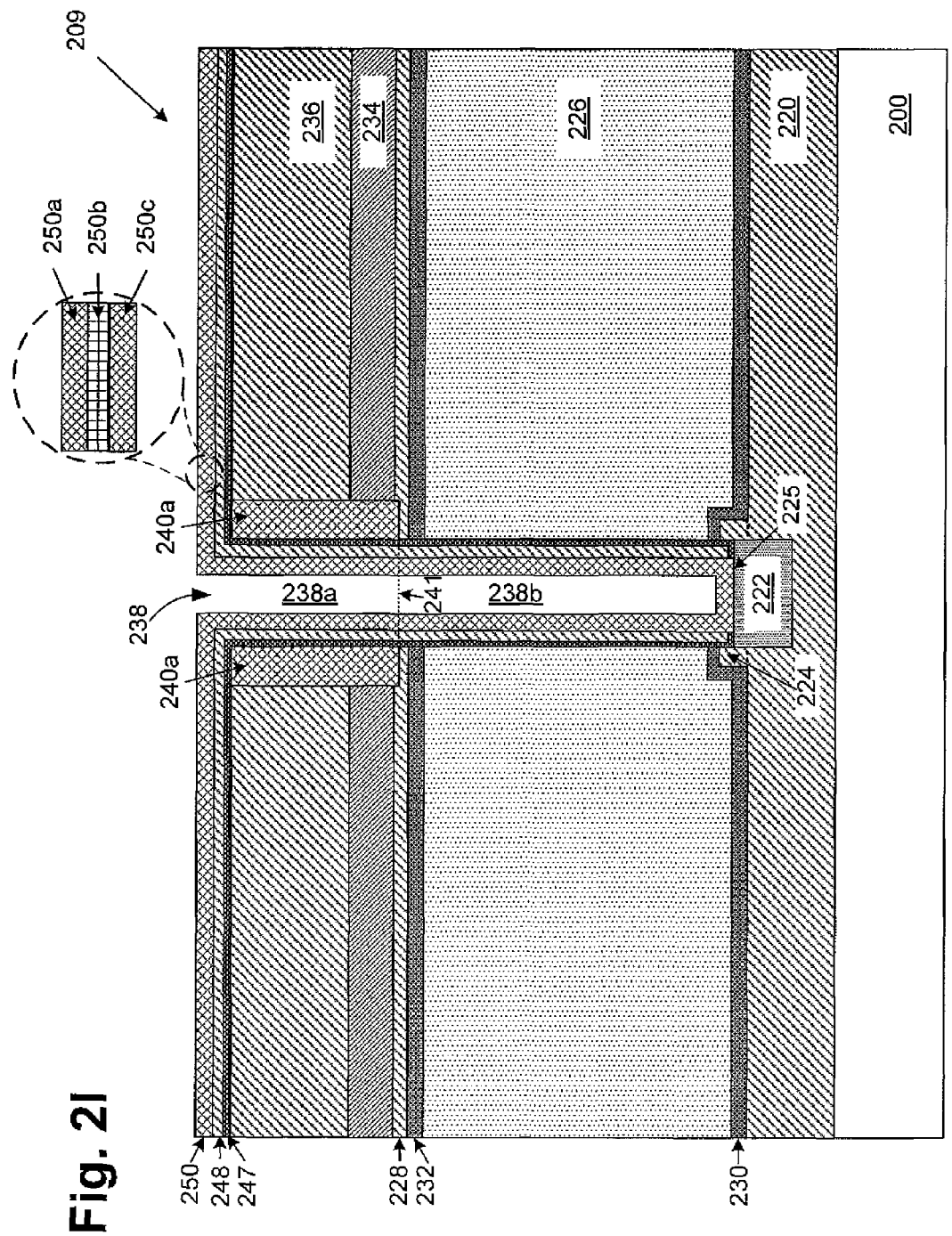
FIG. 2I illustrates a cross-sectional view of a portion of a self-supported MEMS structure with a via cap processed in accordance with an intermediate action in the flowchart of FIG. 1 according to one implementation of the present application.
Figure 2J:
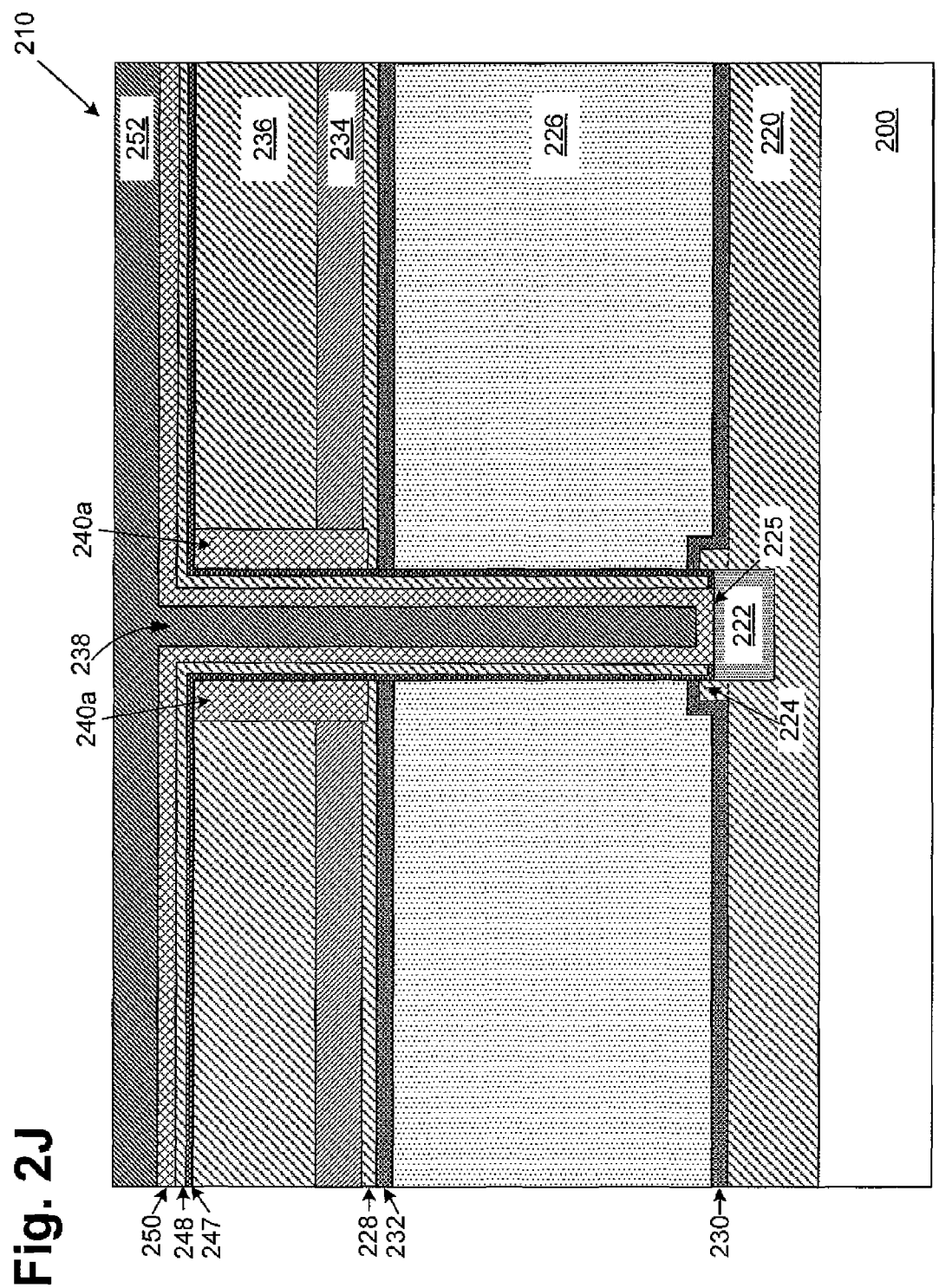
FIG. 2J illustrates a cross-sectional view of a portion of a self-supported MEMS structure with a via cap processed in accordance with an intermediate action in the flowchart of FIG. 1 according to one implementation of the present application.
Figure 2K:
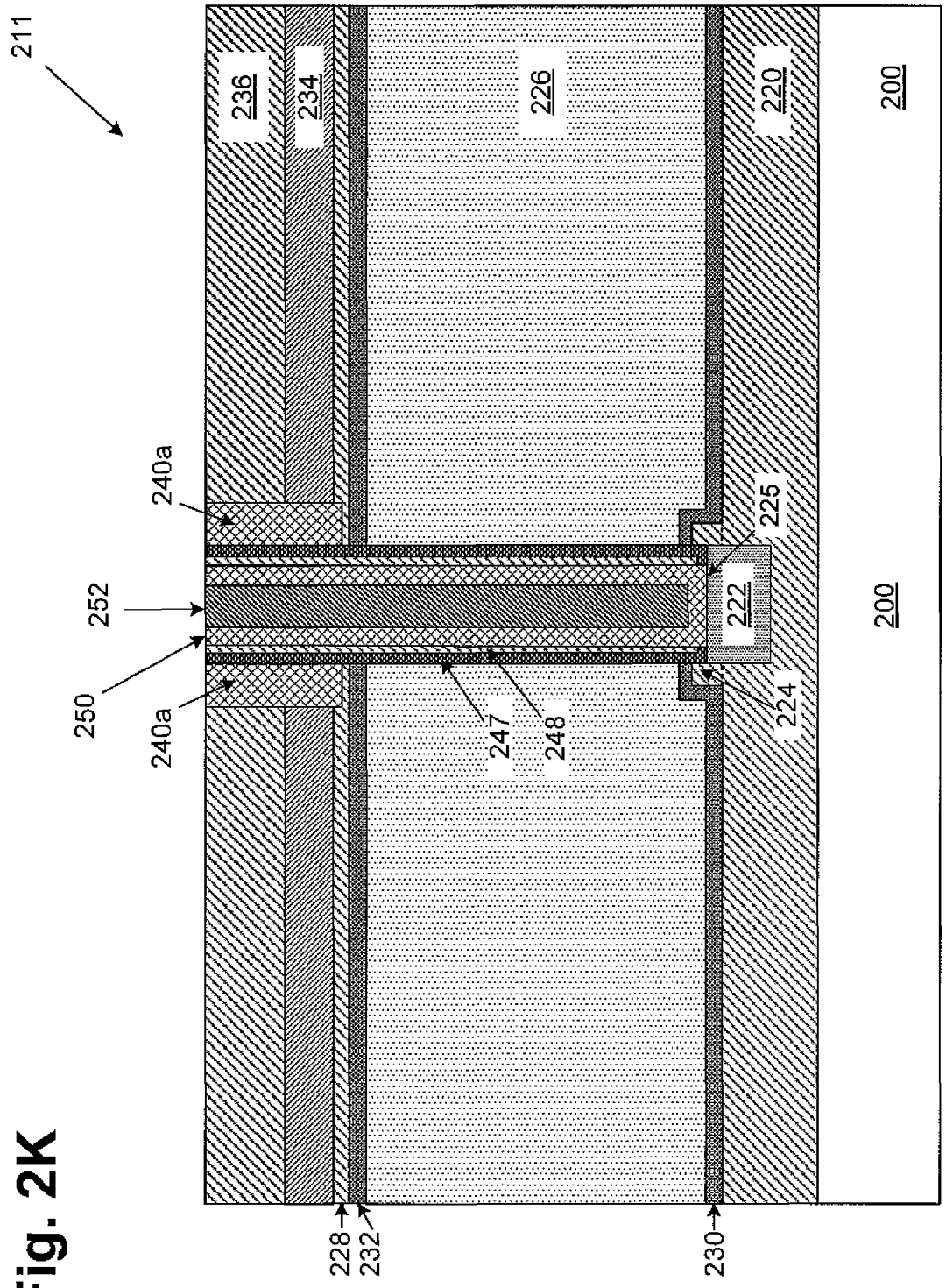
FIG. 2K illustrates a cross-sectional view of a portion of a self-supported MEMS structure with a via cap processed in accordance with an intermediate action in the flowchart of FIG. 1 according to one implementation of the present application.
Figure 2L:
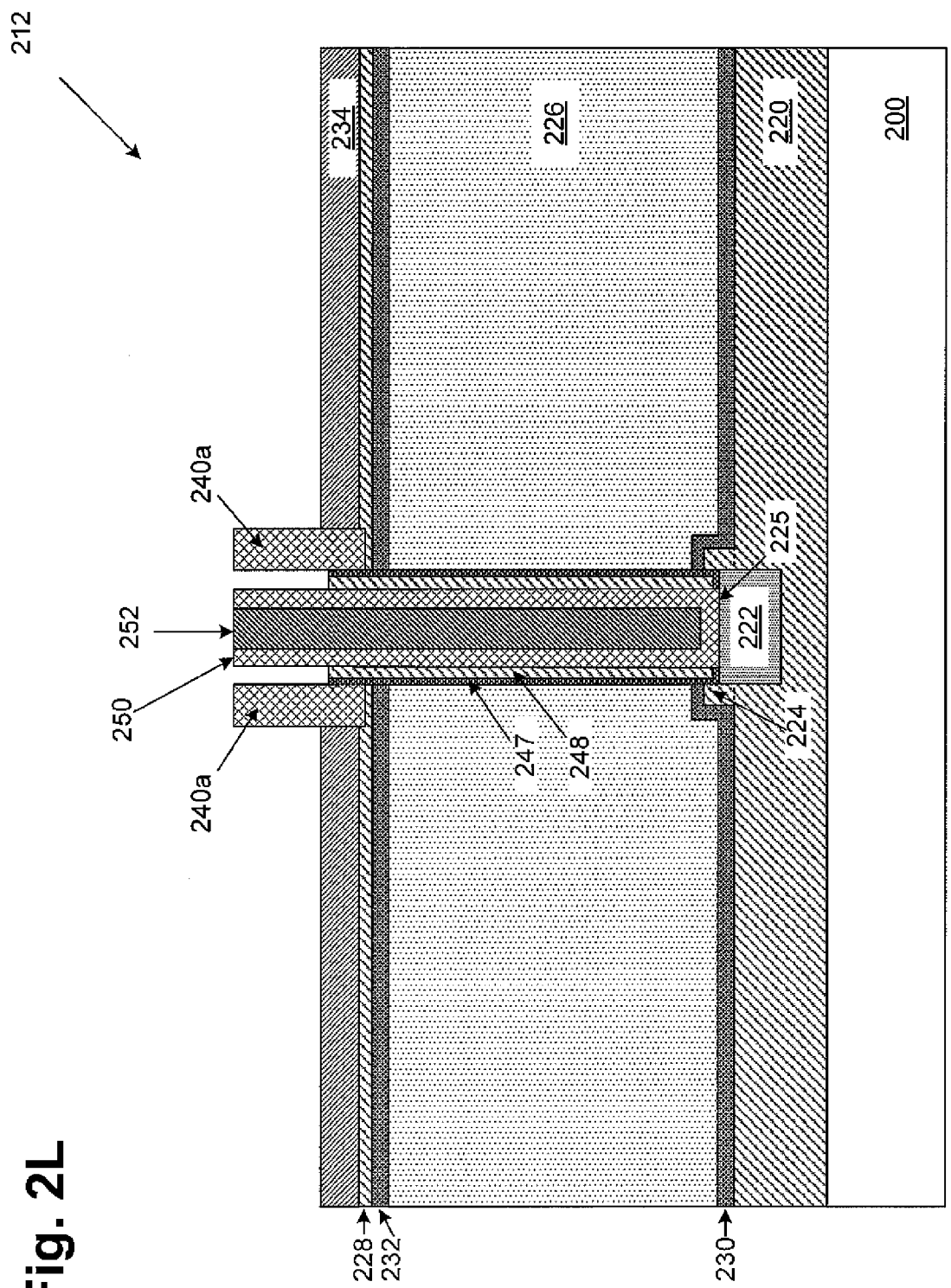
FIG. 2L illustrates a cross-sectional view of a portion of a self-supported MEMS structure with a via cap processed in accordance with an intermediate action in the flowchart of FIG. 1 according to one implementation of the present application.
Figure 2M:
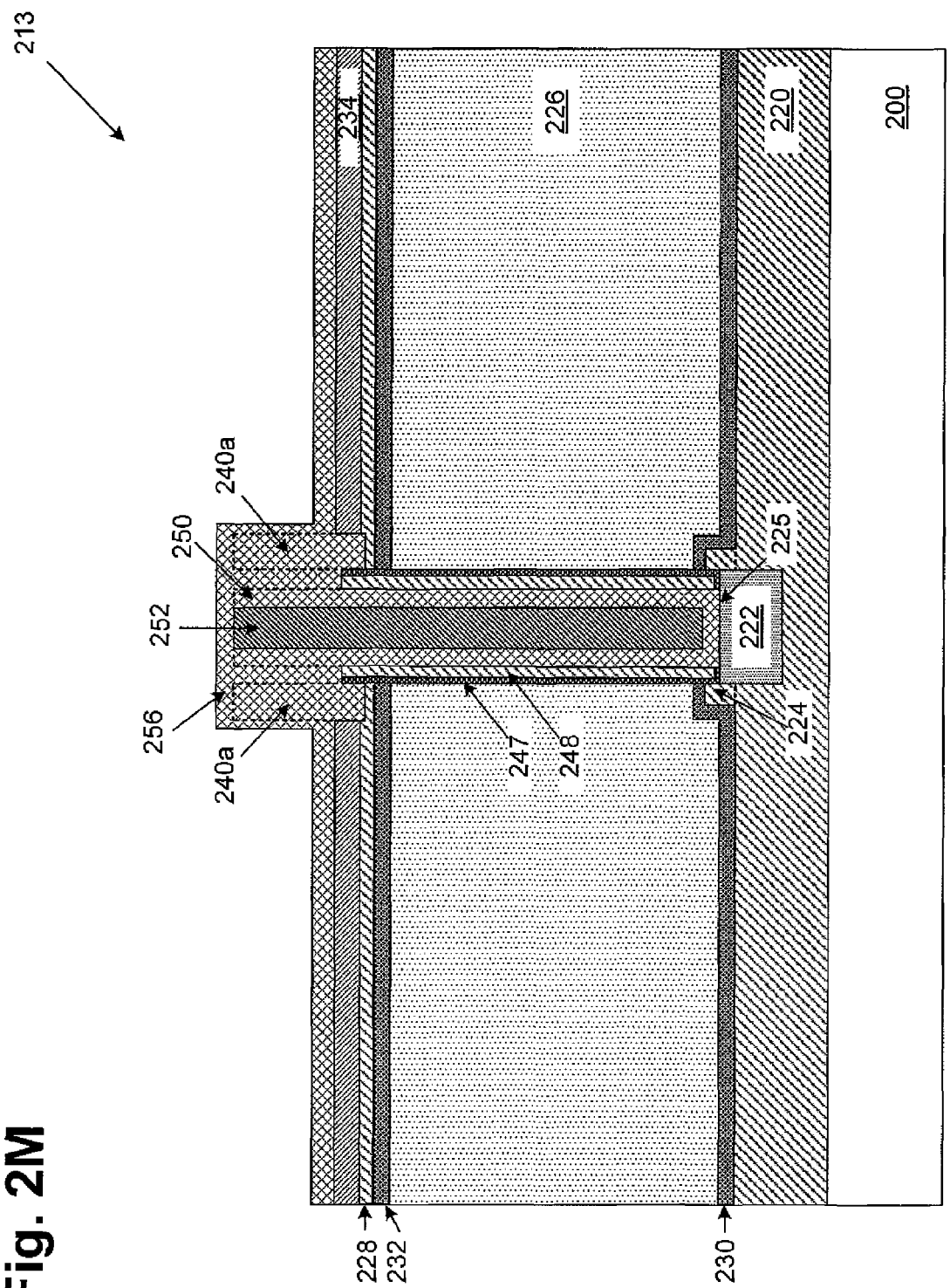
FIG. 2M illustrates a cross-sectional view of a portion of a self-supported MEMS structure with a via cap processed in accordance with an intermediate action in the flowchart of FIG. 1 according to one implementation of the present application.
Figure 2N:
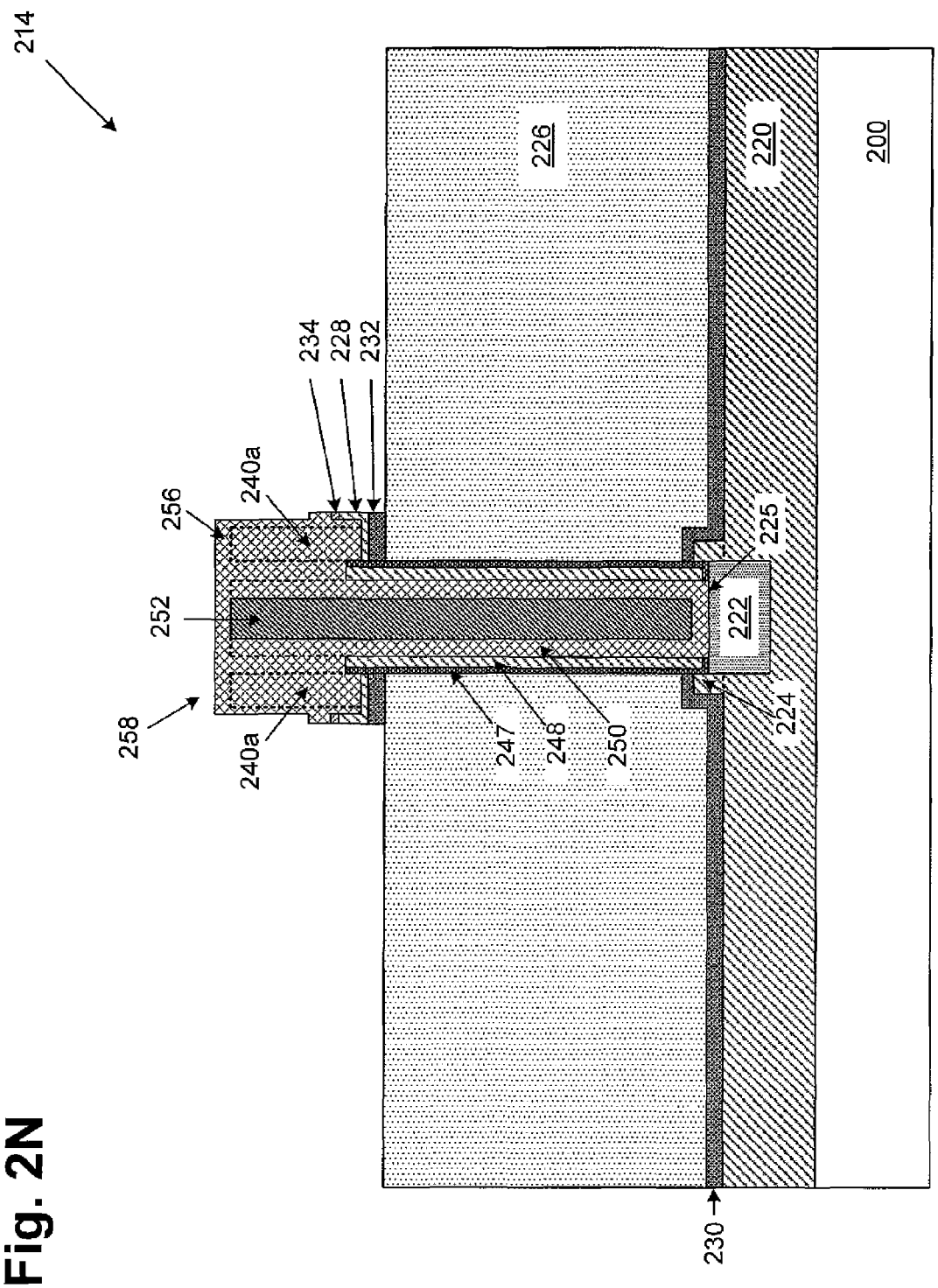
FIG. 2N illustrates a cross-sectional view of a portion of a self-supported MEMS structure with a via cap processed in accordance with an intermediate action in the flowchart of FIG. 1 according to one implementation of the present application.
Figure 2O:
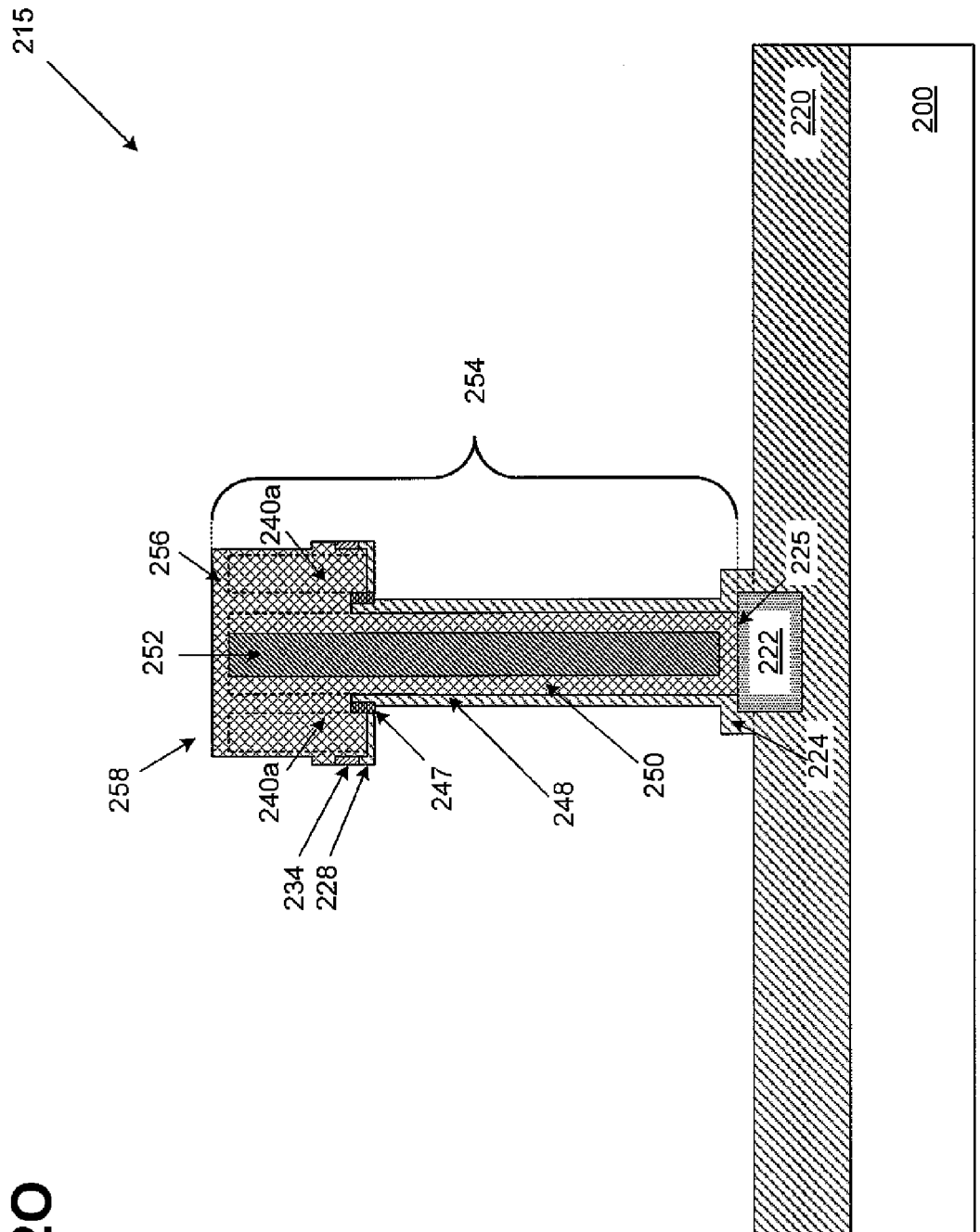
FIG. 2O illustrates a cross-sectional view of a portion of a self-supported MEMS structure with a via cap processed in accordance with a final action in the flowchart of FIG. 1 according to one implementation of the present application.

In FIGS. 2A through 2O, structures 201 through 215 illustrate the result of performing actions 101 through 115 of flowchart 100, respectively. For example, structure 201 is a portion of a self-supported MEMS structure with a via cap after processing action 101, structure 202 is an exemplary structure after the processing of action 102, structure 203 is an exemplary structure after the processing of action 103, and so forth.

Referring to action 101 in FIG. 1 and structure 201 in FIG. 2A, structure 201 shows a portion of an exemplary self-supported MEMS structure with a via cap having a polymer layer formed over a MEMS plate over a substrate, and a first dielectric layer formed over the polymer layer, after completion of action 101 of flowchart 100 in FIG. 1. As illustrated in FIG. 2A, structure 201 includes substrate 200, underlying oxide layer 220, MEMS plate 222, conformal oxide layer 224, polymer layer 226, first dielectric layer 228, and optional adhesion promoting (AP) layers 230 and 232.

Prior to action 101 of flowchart 100, MEMS plate 222 is formed in underlying oxide layer 220 over substrate 200. In the present implementation, substrate 200 may be a silicon substrate. In other implementations, substrate 200 may include other suitable substrate material, such as silicon-on-insulator (SOI), silicon-on-sapphire (SOS), silicon germanium, germanium, an epitaxial layer of silicon formed on a silicon substrate, or the like. In the present implementation, underlying oxide layer 220 may include silicon oxide or silicon rich oxide, for example. MEMS plate 222 is formed in underlying oxide layer 220. For example, in the present implementation, MEMS plate 222 may be a portion of a reflector of a microbolometer.

In another implementation, MEMS plate 222 may be a portion of a bi-layer actuator for a MEMS device fabricated from aluminum, for example. In yet another implementation, MEMS plate 222 may be a portion of an interconnect metal of a MEMS device. As illustrated in FIG. 2A, a portion of MEMS plate 222 protrudes from underlying oxide layer 220, and is covered by conformal oxide layer 224, where conformal oxide layer 224 may be formed by the same material as underlying oxide layer 220 to form a silicon rich interface for receiving polymer layer 226.

As illustrated in FIG. 2A, polymer layer 226 is formed over underlying oxide layer 220 and conformal oxide layer 224. AP layer 230 may be optionally formed over underlying oxide layer 220 and conformal oxide layer 224 before the deposition of polymer layer 226 to improve adhesion between the polymer and the oxide layers. In the present implementation, polymer layer 226 may include polyimides. In other implementations, exemplary materials that may be used to form polymer layer 226 may include, but not limited to, polyamides (e.g., HD-2610), SU-8 photoresist, spin-on dielectrics (SOD), long chain polymers up to 10 microns. Polymer layer 226 may also include polyarylates, polybenzimidazole, polybutylene, polycarbonate, polyesters, polyetherimide, polyethylene, polyethylene copolymers and modified polyethylenes, polyketones, polymethyl methacrylate, polymethylpentene, polyphenylene oxides and polyphenylene sulfides, polyphthalamide, polypropylene, polyurethanes, styrenic resins, sulphone based resins, vinyl-based resins or any combination thereof.

Thereafter, first dielectric layer 228 is formed over polymer layer 226. First dielectric layer 228 may include an oxide layer having silicon oxide or silicon rich oxide, for example. In one implementation, first dielectric layer 228 may include a silicon rich surface interfacing polymer layer 226. First dielectric layer 228 may be formed over polymer layer 226 using physical vapor deposition (PVD), chemical vapor deposition (CVD), plasma enhanced chemical vapor deposition (PECVD), thermal CVD, or spin-coating. In other implementations, first dielectric layer 228 may be formed by using other deposition methods, such as high density plasma (HDP), ion beam deposition (IBD), or ion assisted deposition (IAD).

Similar to AP layer 230, AP layer 232 may be optionally formed over polymer layer 226 before the deposition of first dielectric layer 228 to improve adhesion between polymer layer 226 and first dielectric layer 228. In the present implementation, AP layers 230 and 232 may be a spin on water-soluble material. In other implementations, AP layers 230 and 232 may be any other appropriate adhesion promoting material known in the art.

Referring to action 102 in FIG. 1 and structure 202 in FIG. 2B, structure 202 shows a portion of an exemplary self-supported MEMS structure with a via cap having a metal etch stop layer formed over a first dielectric layer, after completion of action 102 of flowchart 100 in FIG. 1. Specifically, in structure 202, metal etch stop layer 234 is deposited over first dielectric layer 228. For example, metal etch stop layer 234 may be made of titanium (Ti), titanium nitride (TiN), or a combination of both materials. Metal etch stop layer 234 together with first dielectric layer 228 are configured to protect polymer layer 226 and preserve the thickness of polymer layer 226 over the entire semiconductor wafer throughout the entire process flow. As such, polymer layer 226 is well preserved in all areas of the semiconductor wafer to provide a substantially flat surface, as a foundation, for additional semiconductor structures built over polymer layer 226.

Referring to action 103 in FIG. 1 and structure 203 in FIG. 2C, structure 203 shows a portion of an exemplary self-supported MEMS structure with a via cap having a second dielectric layer over a metal etch stop layer, where the second dielectric layer is planarized, after completion of action 103 of flowchart 100 in FIG. 1. Specifically, in structure 203, second dielectric layer 236 is formed over metal etch stop layer 234. For example, second dielectric layer 236 is formed on metal etch stop layer 234 by using PECVD. In the present implementation, second dielectric layer 236 may include silicon oxide. In another implementation, second dielectric layer 236 may include silicon nitride, or other appropriate dielectric material. In cases where second dielectric layer 236 is made of ceramic material, second dielectric layer 236 would shrink as it cools down, thereby creating much stress which could lead to delamination of second dielectric layer 236 from metal etch stop layer 234. To reduce the stress in second dielectric layer 236, in one implementation, second dielectric layer 236 may be formed by modifying deposition conditions.

As illustrated in FIG. 2C, in the present implementation, second dielectric layer 236 may have a thickness that is substantially thicker than first dielectric layer 228. The thickness of second dielectric layer 236 is critical. For example, an appropriate thickness of second dielectric layer 236 has to be carefully selected such that it has a sufficient thickness to serve as a protective stop layer during subsequent processing actions, and at the same time not overly thick since second dielectric layer 236 would not adhere thus peel off from metal etch stop layer 234.

Referring to action 104 in FIG. 1 and structure 204 in FIG. 2D, structure 204 shows a portion of an exemplary self-supported MEMS structure with a via cap having a first portion of a trench formed over a MEMS plate, where the first portion of the trench extends through a second dielectric layer and a metal etch stop layer into a first dielectric layer, after completion of action 104 of flowchart 100 in FIG. 1. Specifically, in structure 204, first portion 238a of trench 238 is formed over MEMS plate 222. As illustrated in FIG. 2D, first portion 238a of trench 238 has width 239a that is wider than a width of MEMS plate 222. Width 239a of first portion 238a is scalable, and can help define and maintain the critical demission (CD) of a second portion of trench 238 to be formed in a subsequent action.

First portion 238a of trench 238 may be formed by reactive ion etching (RIE) using oxygen with fluorine based chemistry or sulfur dioxide type chemistry, for example. In other implementations, first portion 238a of trench 238 may be formed by other suitable etching processes known in the art. After the RIE, wet cleans may be performed to ensure that structure 204 has smooth and clean surfaces free from residues, impurities and other unwanted material. As illustrated in FIG. 2D, the etching process etches through second dielectric layer 236 and metal etch stop layer 234. As illustrated in FIG. 2D, first portion 238a extends into first dielectric layer 228. In another implementation, the etching of first portion 238a terminates on a top surface of first dielectric layer 228.

Referring to action 105 in FIG. 1 and structure 205 in FIG. 2E, structure 205 shows a portion of an exemplary self-supported MEMS structure with a via cap having a via collar metal formed on sidewalls and a bottom of a first portion of a trench, after completion of action 105 of flowchart 100 in FIG. 1. Specifically, in structure 205, via collar metal 240 is formed conformal over structure 204 shown in FIG. 2D. As illustrated in FIG. 2E, via collar metal 240 lines a top surface of second dielectric layer 236, and sidewalls and a bottom of first portion 238a of trench 238. For example, via collar metal 240 may be made of Ti, TiN, or a combination of both materials. In other implementations, via collar metal 240 may include other suitable metallic material. Referring to action 106 in FIG. 1 and structure 206 in FIG. 2F, structure 206 shows a portion of an exemplary self-supported MEMS structure with a via cap having excess portions of a via collar metal removed such that the portions of the via collar metal along sidewalls of a first portion of trench remain to form a via collar for the trench, after completion of action 106 of flowchart 100 in FIG. 1. Specifically, in structure 206, portions of via collar metal 240 deposited on a top surface of second dielectric layer 236 and at the bottom of first portion 238a of trench 238 in structure 205 in FIG. 2E are etched way by, for example, an anisotropic etch. Exemplary etchants for performing an anisotropic etch may include chlorine based etchants and fluorine based etchants, such as CF4, NF3, CHF3 and SF6. In the present implementation, the via collar metal etch terminates on first dielectric layer 228. In another implementation, the via collar metal etch may entirely remove first dielectric layer 228 and AP layer 232 under first portion 238a of trench 238 and expose a portion of polymer layer 226.

After the via collar metal etch, the remaining portions of via collar metal 240 on the sidewalls of first portion 238a of trench 238 form via collar 240a. It is noted that, although via collar 240a appears to have two segments in structure 206 in a cross-sectional view in FIG. 2F, via collar 240a may have a continuous circular, oval or rectangular shape (not shown in FIG. 2F) surrounding the sidewalls of first portion 238a of trench 238, if viewed from the top of structure 206. Since via collar 240a is formed on the sidewalls of first portion 238a of trench 238, via collar 240a may act an etch stop layer to help define and maintain a width of a second portion of trench 238, which is a critical demission (CD) of a via to be formed in a subsequent action.

Referring to action 107 in FIG. 1 and structure 207 in FIG. 2G, structure 207 shows a portion of an exemplary self-supported MEMS structure with a via cap having a second portion of a trench formed above a MEMS plate, where the second portion of the trench extends through a first dielectric layer, a polymer layer and a conformal oxide layer to expose a top surface of the MEMS plate, after completion of action 107 of flowchart 100 in FIG. 1. Specifically, in structure 207, second portion 238b of trench 238 extends from the bottom of first portion 238a, indicated by dash line 241, to top surface 225 of MEMS plate 222. Second portion 238b of trench 238 may be formed by reactive ion etching (RIE) using oxygen with fluorine based chemistry or sulfur dioxide type chemistry, for example. After the RIE, wet cleans may be performed to ensure that structure 207 has smooth and clean surfaces free from residues, impurities and other unwanted material.

As illustrated in FIG. 2G, the etching process etches through first dielectric layer 228, AP layer 232, polymer layer 226, AP layer 230, and conformal oxide layer 224. Also, second portion 238b of trench 238 exposes top surface 225 of MEMS plate 222. In another implementation, the etching of second portion 238b of trench 238 stops on a top surface of conformal oxide layer 224, which can be removed in a later processing action. As can be seen in FIG. 2G, via collar 240a in first portion 238a not only defines width 239b of second portion 238b of trench 238, but also prevents any change in via critical dimension (e.g., width 239a of first portion 238a) during the formation of second portion 238b. Thus, by utilizing via collar 240a, the critical dimensions of trench 238 can be well maintained.

Referring to action 108 in FIG. 1 and structure 208 in FIG. 2H, structure 208 shows a portion of an exemplary self-supported MEMS structure with a via cap having an adhesion promotion layer and an oxide liner formed on sidewalls of a via collar and sidewalls of a second portion of a trench, after completion of action 108 of flowchart 100 in FIG. 1. Specifically, in structure 208, AP layer 247 and oxide liner 248 are formed over second dielectric layer 236 and on sidewalls of via collar 240a, sidewalls of second portion 238b of trench 238, and a bottom surface of second portion 238b. As illustrated in FIG. 2H, oxide liner 248 is formed on top surface 225 of MEMS plate 222. In present implementation, oxide liner 248 may include silicon oxide or silicon rich oxide. In another implementation, oxide liner 248 may include a tetraethylorthosilicate (TEOS) liner. Oxide liner 248 may be formed by depositing an oxide using deposition methods such as PVD, CVD, PECVD, thermal CVD, or spin-coating, then etching back the deposited oxide using a blanket etch, for example. Oxide liner 248 encapsulates polymer layer 226, and acts as a protective layer to prevent polymer layer 226 from outgassing and deformation during subsequent metal deposition and annealing processes. Oxide liner 248 can also provide mechanical rigidity for filler materials subsequently deposited in trench 238 to form a self-supported MEMS structure. Moreover, oxide liner 248 can improve the adhesion between the filler materials subsequently deposited in trench 238 and polymer layer 226, thereby substantially improve the electrical and mechanical robustness of a subsequently built via.

As further illustrated in FIG. 2H, AP layer 247 may be optionally formed between oxide liner 248 and polymer layer 226 to improve the adhesion between the two layers. Although AP layer 247 is not required, the presence of AP layer 247 in combination with oxide liner 248 may significantly improve the adherence between a subsequently deposited metal liner and/or metallic filler and polymer layer 226. Encasing the semiconductor wafer using AP layer 247 may also simplify the integration of high stress metals, such as tungsten, with polymer layer 226. In the present implementation, AP layer 247 may be a spin on water-soluble material. In other implementations, AP layer 247 may be any other appropriate adhesion promoting material known in the art.

Referring to action 109 in FIG. 1 and structure 209 in FIG. 2I, structure 209 shows a portion of an exemplary self-supported MEMS structure with a via cap having metal liner formed over an oxide liner on sidewalls and a bottom surface of a trench, after completion of action 109 of flowchart 100 in FIG. 1. As illustrated in FIG. 2I, metal liner 250 is formed over oxide liner 248 on sidewalls and the bottom of trench 238. Metal liner 250 may be formed by using any suitable deposition process. In the present implementation, metal liner 250 may include Ti layer 250a, TiN layer 250b, and Ti layer 250c, where TiN layer 250b is particularly formed as a Ti rich layer. A Ti rich layer may improve integration between metal liner 250 and a subsequently deposited metallic filler in trench 238. As further illustrated in FIG. 2I, in the present implementation, portions of oxide liner 248 and AP layer 247 at the bottom of trench 238 may be removed prior to the deposition of metal liner 250, such that metal liner 250 is in direct contact with top surface 225 of MEMS plate 222. In other implementations, oxide liner 248 and AP layer 247 at the bottom of trench 238 need not be removed prior to the formation of metal liner 250. Oxide liner 248 provides mechanical rigidity, thermal and chemical protection for polymer layer 226 during the deposition of metal liner 250.

Referring to action 110 in FIG. 1 and structure 210 in FIG. 2J, structure 210 shows a portion of an exemplary self-supported MEMS structure with a via cap having a metallic filler deposited in a trench to form a via over a MEMS plate, after completion of action 110 of flowchart 100 in FIG. 1. Specifically, in structure 214, metallic filler 252 is deposited in trench 238 by using low pressure chemical vapor deposition (LPCVD), for example, to form a via. In the present implementation, metallic filler 252 may include tungsten (W). In another implementation, metallic filler 252 may include other metallic material, such as Ti or any other suitable electrically conductive metallic filler or metallic filler stack. As tungsten may experience high stress during the deposition process, metal liner 250 having titanium rich layer as a CVD seed layer can advantageously help reduce the stress level in metallic filler 252.

Also, during the formation of the via, as polymer layer 226 is passivated by first dielectric layer 228 and oxide liner 248, polymer layer 226 is prevented from outgassing and deformation. As such, polymer layer 226 is able to provide a flat top surface in other areas of the semiconductor wafer for fabrication of other semiconductor devices, such as CMOS devices, over polymer layer 226. In addition, oxide liner 248 can improve adhesion between metallic filler 252 and polymer layer 226. Also, oxide liner 248 can provide a rigid structure during the deposition of metal liner 250 and metallic filler 252, as compared to depositing metal liner 250 and metallic filler 252 directly in polymer layer 226 without using oxide liner 248.

Referring to action 111 in FIG. 1 and structure 211 in FIG. 2K, structure 211 shows a portion of an exemplary self-supported MEMS structure with a via cap having portions of a metallic filler, a metal liner, a via collar, an oxide liner, an AP layer and a second oxide polished away by using, for example, chemical-mechanical polishing (CMP) process, such that the metallic filler has a substantially co-planar top surface with the metal liner, the via collar, the oxide liner, the AP layer and the second dielectric layer, after completion of action 111 of flowchart 100 in FIG. 1. As illustrated in FIG. 2K, structure 211 is planarized by, for example, CMP, such that excess portions of metallic filler 252, metal liner 250, oxide liner 248, AP layer 247, via collar 240a, and second dielectric layer 236 as appeared in structure 210 in FIG. 2J are removed. As a result, metallic filler 252, metal liner 250, oxide liner 248, AP layer 247, via collar 240a, and second dielectric layer 236 have a substantially co-planar top surface in structure 211.

Referring to action 112 in FIG. 1 and structure 212 in FIG. 2L, structure 212 shows a portion of an exemplary self-supported MEMS structure with a via cap having a second dielectric layer removed, after completion of action 112 of flowchart 100 in FIG. 1. As illustrated in FIG. 2L, second dielectric layer 236 as shown in structure 211 in FIG. 2K is removed by, for example, a blanket oxide etch. The blanket oxide etch terminates on metal etch stop layer 234. Exemplary etchants for performing a blanket oxide etch may include fluorine rich chemistry. As illustrated in FIG. 2L, portions of oxide liner 248 and AP layer 247 may also be removed during the blanket oxide etch back action, while via collar 240a remains after the etch.

Referring to action 113 in FIG. 1 and structure 213 in FIG. 2M, structure 213 shows a portion of an exemplary self-supported MEMS structure with a via cap having a metal cap layer deposited over an etch stop metal layer, a via collar, a metal liner and a metallic filler, after completion of action 113 of flowchart 100 in FIG. 1. Specifically, in structure 213, metal cap layer 256 is formed conformal over structure 212 shown in FIG. 2L. As illustrated in FIG. 2M, metal cap layer 256 is deposited over metal etch stop layer 234, via collar 240a, metal liner 250 and metallic filler 252. Metal cap layer 256 also fills the gap between via collar 240a and metal liner 250 shown in FIG. 2L. For example, metal cap layer 256 may be made of titanium, titanium nitride, or a combination of both materials. In the present implementation, via collar 240a, metal liner 250 and metal cap layer 256 may include substantially the same composition. In other implementations, metal cap layer 256 may include other suitable electrically conductive material or metallic stack.

Referring to action 114 in FIG. 1 and structure 214 in FIG. 2N, structure 214 shows a portion of an exemplary self-supported MEMS structure with a via cap, where excess portions of a metal cap layer, an etch stop metal layer, a first dielectric layer and an AP layer are removed, such that the remaining portions of the metal cap layer and the via collar form a via cap, after completion of action 114 of flowchart 100 in FIG. 1. Specifically, in structure 214, a layer of photoresist layer (not shown in FIG. 2N) may be formed and patterned over via cap 258, while areas in structure 214 not covered by the photoresist layer undergo various removal processes known in the art. For example, chlorine rich chemistry may be used to remove metal etch stop layer 234, while fluorine rich chemistry may be used to remove first dielectric layer 228 and AP layer 232. As illustrated in FIG. 2N, the remaining portions of metal cap layer 256 and via collar 240a form via cap 258 in structure 214. Via cap 258 is configured to improve mechanical stability and electrical connectivity of the MEMS structure.

Referring to action 115 in FIG. 1 and structure 215 in FIG. 2O, structure 215 shows a portion of an exemplary self-supported MEMS structure with a via cap, where a polymer layer and optional AP layers are removed, after completion of action 115 of flowchart 100 in FIG. 1. Specifically, in structure 215, polymer layer 226 and optional AP layers 230, 232 and 247 as appeared in structure 214 in FIG. 2N are removed by, for example, various removal processes known in the art. It is noted that optional AP layer 247 is not shown in FIG. 2O, such that oxide liner 248 and conformal oxide layer 224 form a continuous coating outside metal liner 250 and metallic filler 252.

As illustrated in FIG. 2O, after the removal of the above-mentioned layers, via 254 is disposed on MEMS plate 222 over substrate 200. Via 254 includes metal liner 250 metallic filler 252 coated with oxide liner 248, and via cap 258 having via collar 240a and metal cap layer 256. Since oxide liner 248 provides mechanical rigidity for metal liner 250 and metallic filler 252, via 254 is a self-supported structure over top surface 225 of MEMS plate 222 after the removal of second dielectric layer 236, metal etch stop layer 234, first dielectric layer 228, polymer layer 226 and optional AP layers 230, 232 and 247. As such, via 254 is supported only on a bottom thereof by substrate 200 without a need for additional structural support. Via cap 258 may be used to connect a group of neighboring vias to further enhance the mechanical, electrical and thermal properties of the MEMS structures.

By way of examples only, during the present implementation method, underlying oxide layer 220 may have a thickness of about 1-100 microns; conformal oxide layer 224 may have a thickness of equal to or greater than 100 angstroms; polymer layer 226 may have a thickness of about 1.5-2.5 microns; first dielectric layer 228 may have a thickness of equal to or greater than 100 angstroms; optional AP layers 230, 232 and 247 may each have a thickness of about 60-100 angstroms; metal etch stop layer 234 may have a thickness of about 500 angstroms; second dielectric layer 236 may have a thickness of about 0.2-1 microns; via collar metal 240 may have a thickness of 300-600 angstroms; oxide liner 248 may have a thickness of about 500-1500 angstroms; metal liner 250 may have a thickness of about 300-1000 angstroms; metallic filler 252 may have a thickness of about 2500-6500 angstroms; metal cap layer 256 may have a thickness of 300-2000 angstroms. However, these thicknesses may be greater than or less than the above specified thicknesses depending on specific requirements of different implementations.

Figure 3:
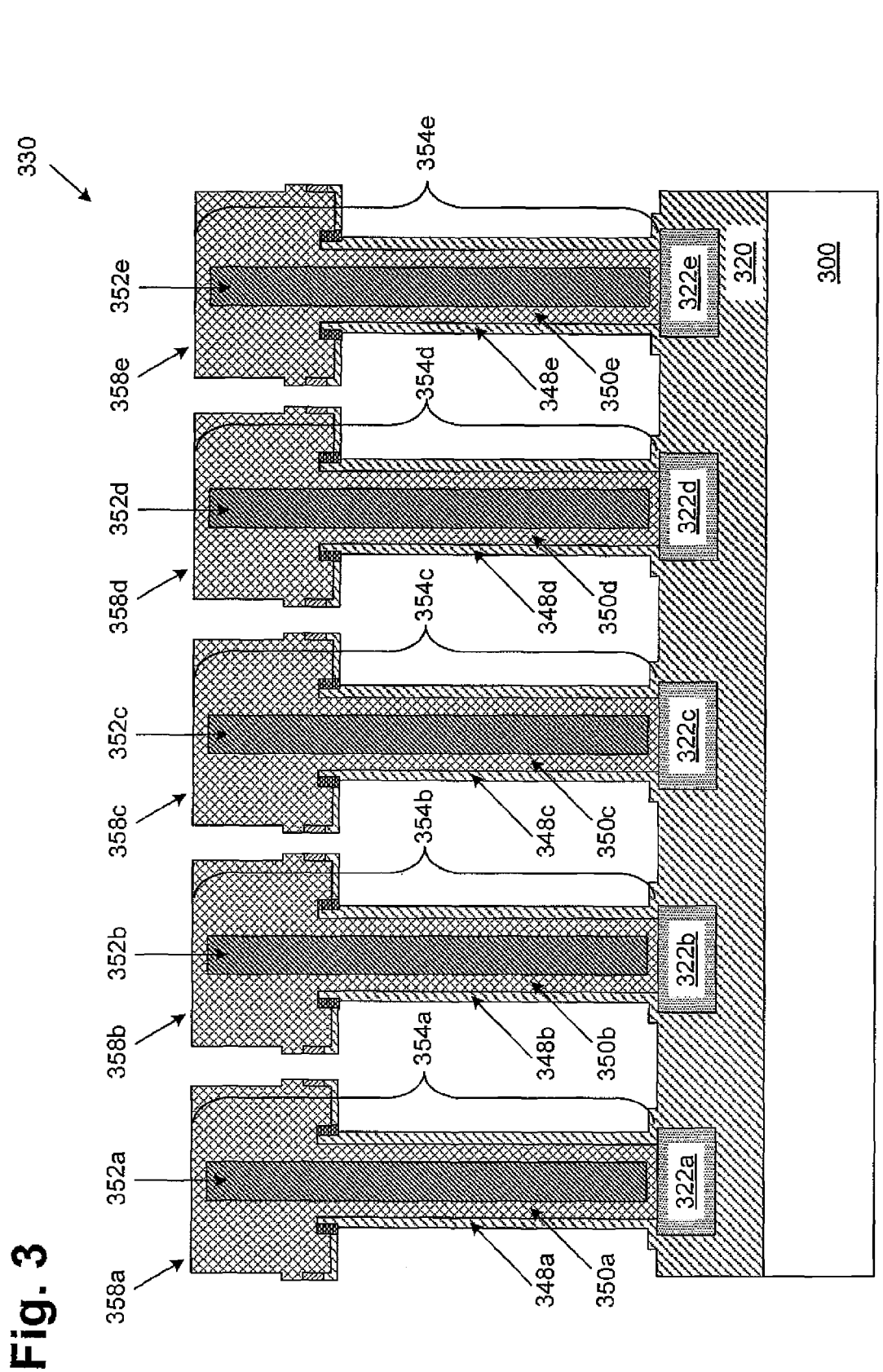
FIG. 3 illustrates a cross-sectional view of an array of self-supported MEMS structures with via caps according to one implementation of the present application.

As illustrated in FIG. 3, structure 330 shows an array of self-supported MEMS structures with via caps, according an implementation of the present application. Specifically, vias 354a through 354e are formed on MEMS plates 322a through 322e, respectively, in underlying oxide layer 320 over substrate 300. Vias 354a through 354e may each correspond to via 254 in FIG. 2O, and each constitute a self-supported structure over a respective MEMS plate. For example, via 354a is disposed on MEMS plate 322a over substrate 300, where via 354a includes metal liner 350a and metallic filler 352a coated with oxide liner 348a, and via cap 358a. As illustrated in FIG. 3, vias 354b through 354e have substantially the same structure as via 354a. For example, via 354b includes metal liner 350b and metallic filler 352b coated with oxide liner 348b, and via cap 358b. Via 354c includes metal liner 350c and metallic filler 352c coated with oxide liner 348c, and via cap 358c. Via 354d includes metal liner 350d and metallic filler 352d coated with oxide liner 348d, and via cap 358d. Via 354e includes metal liner 350e and metallic filler 352e coated with oxide liner 348e, and via cap 358e.

In contrast to vias formed using conventional processes, vias 354a through 354e may have high aspect ratio of 4:1 or 5:1. In other implementations, instead of forming an array of vias as shown in FIG. 3, methods according to the present application may be used to form a trench-like structure having a metallic filler, where an oxide liner is utilized to encase the sidewalls and the bottom of the trench, such that the trench-like structure can stand on its own over a MEMS plate to form a self-supported MEMS structure.

The present inventive concepts utilize a via collar to define and maintain a via width, which is a critical demission of the via. The via collar together with a metal cap layer form a via cap to improve mechanical stability and electrical connectivity of a MEMS structure. Multiple via caps may be used to connect a group of neighboring vias to further enhance the mechanical, electrical, and thermal properties of the MEMS structures. The present inventive concepts also utilize an oxide liner, such as a silicon rich oxide film, to coat sidewalls of vias formed in a carbonaceous sacrificial material, such as polyimide and other polymers, to encase metallic structure formed in the vias. The oxide liner prevents the carbonaceous sacrificial material from outgassing and deformation. The oxide liner also enhances the adhesion between the metal structures and the carbonaceous sacrificial material to substantially improve the electrical and mechanical robustness of the vias, such that the vias and underlying MEMS plates form self-supported MEMS structures after the carbonaceous sacrificial material is removed. Also, the oxide liner provides a chemically resistant surface encasing metallic structure inside the vias, which in turn enables more aggressive and robust BEOL processing. It should be understood that the methods disclosed in the present application are highly scalable, such that arrays of electrical and structural self-supported MEMS features can be formed in a semiconductor wafer according to the present inventive concepts. Also, the methods described in the present application may utilize standard high volume CMOS process modules using high volume CMOS manufacturing methods which are leveraged in such a way to manufacture MEMS devices.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A self-supported MEMS structure comprising:
    a MEMS plate over a substrate;
    a via contacting said MEMS plate, wherein said via comprises:
        a trench and an oxide liner on sidewalls of said trench;
        a metallic filler in said trench;
        a via cap over said metallic filler;
        wherein said via is supported only on a bottom thereof by said substrate.

2. The self-supported MEMS structure of claim 1, wherein said via cap comprises a via collar and a metal cap layer.

3. The self-supported MEMS structure of claim 1, further comprising a via collar surrounding a first portion of said trench.

4. The self-supported MEMS structure of claim 3, wherein said via collar comprises a metal selected from the group consisting of titanium and titanium nitride.

5. The self-supported MEMS structure of claim 1, wherein said oxide liner is a silicon rich oxide liner.

6. The self-supported MEMS structure of claim 1, wherein said oxide liner provides mechanical rigidity for said metallic filler of said via.

7. The self-supported MEMS structure of claim 1, further comprising a metal liner between said oxide liner and said metallic filler.

8. The self-supported MEMS structure of claim 7, wherein said metal liner comprises a titanium layer, a titanium nitride layer and another titanium layer.

9. The self-supported MEMS structure of claim 1, wherein said metallic filler comprises tungsten.

10. A method of forming a self-supported MEMS structure, said method comprising:
    forming a polymer layer over a MEMS plate over a substrate;
    forming a via collar along sidewalls of a first portion of a trench over said polymer layer;
    forming a second portion of said trench within said polymer layer;
    forming an oxide liner in said trench lining sidewalls of said via collar and sidewalls of said second portion of said trench;
    depositing a metallic filler in said trench to form a via;
    forming a metal cap layer over said via collar and said metallic filler;
    removing a portion of said metal cap layer to form a via cap;
    removing said polymer layer such that said via is supported only on a bottom thereof by said substrate.

11. The method of claim 10, further comprising forming a metal liner over said oxide liner in said trench.

12. The method of claim 11, wherein said metal liner comprises a titanium layer, a titanium nitride layer and another titanium layer.

13. The method of claim 10, wherein said oxide liner is a silicon rich oxide liner.

14. The method of claim 10, wherein said oxide liner is configured to improve adhesion between said metallic filler material and said polymer layer.

15. The method of claim 10, wherein said polymer layer comprises polyimides.

16. The method of claim 10, further comprising forming a first dielectric layer over said polymer layer.

17. The method of claim 16, further comprising forming a metal etch stop layer over said first dielectric layer.

18. The method of claim 17, further comprising forming a second dielectric layer over said metal etch stop layer.

19. The method of claim 18, further comprising removing said first dielectric layer, said metal etch stop layer and said second dielectric layer.

20. The method of claim 10, wherein said oxide liner provides mechanical rigidity for said metallic filler of said via.

* * * * *